(12) United States Patent
Nakanishi

(10) Patent No.: US 9,189,325 B2
(45) Date of Patent: *Nov. 17, 2015

(54) MEMORY SYSTEM AND OPERATION METHOD THEREOF

(71) Applicant: Sony Corporation, Tokyo (JP)

(72) Inventor: Kenichi Nakanishi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/273,757

(22) Filed: May 9, 2014

(65) Prior Publication Data

US 2014/0250346 A1   Sep. 4, 2014

Related U.S. Application Data

(63) Continuation of application No. 13/328,399, filed on Dec. 16, 2011, now Pat. No. 8,775,905.

(30) Foreign Application Priority Data

Jan. 25, 2011 (JP) ................. 2011-012544

(51) Int. Cl.
*G11C 29/00* (2006.01)
*G06F 11/10* (2006.01)
*H03M 13/11* (2006.01)
*G11C 7/10* (2006.01)

(52) U.S. Cl.
CPC ........ *G06F 11/1004* (2013.01); *G06F 11/1008* (2013.01); *G06F 11/1048* (2013.01); *G06F 11/1076* (2013.01); *H03M 13/1105* (2013.01); *G11C 7/1006* (2013.01)

(58) Field of Classification Search
CPC .......... G06F 11/1008; G06F 11/1076; G06F 11/1068; G06F 11/1044; G06F 2201/0021; G06F 2201/122; G11B 20/1833; G11C 7/1006
USPC .......................... 714/752, 763, 766, 753, 755
See application file for complete search history.

(56) References Cited

U.S. PATENT DOCUMENTS 5,638,227 A   6/1997   Hamai et al.
7,409,623 B2  8/2008   Baker et al.
(Continued)

FOREIGN PATENT DOCUMENTS

JP   3951918 B2   5/2007
JP   4956922 B2   3/2012

OTHER PUBLICATIONS

Shuhei Tanakamaru et al., "Post-manufacturing, 17-times Acceptable Raw Bit Error Rate Enhancement, Dynamic Codeword Transition ECC Scheme for Highly Reliable Solid-State Drives, SSDs", Memory Workshop (IMW), 2010 IEEE International , pp. 1,4, May 16-19, 2010.

*Primary Examiner* — Esaw Abraham
*Assistant Examiner* — Osman Alshack
(74) *Attorney, Agent, or Firm* — Sony Corporation

(57) ABSTRACT

A memory system includes: a first non-volatile memory used for storing data to be accessed in block units; a second non-volatile memory used for storing data to be accessed in word units in random accesses to the second non-volatile memory; and a control section configured to control operations of the first and second non-volatile memories, wherein error correction codes to be applied to data stored in the second non-volatile memory are held in the first non-volatile memory.

18 Claims, 10 Drawing Sheets

(56) References Cited

U.S. PATENT DOCUMENTS

| | | |
|---|---|---|
| 7,424,593 B2 | 9/2008 | Estakhr et al. |
| 7,635,172 B2 | 12/2009 | Ode |
| 7,873,059 B2 | 1/2011 | Morita et al. |
| 7,961,544 B2 | 6/2011 | Ben-Rubi |
| 8,161,354 B2 | 4/2012 | Chen |
| 8,255,774 B2 * | 8/2012 | Dixon ............................ 714/773 |
| 8,276,043 B2 | 9/2012 | Yano et al. |
| 8,321,765 B2 | 11/2012 | Lee et al. |
| 8,386,884 B2 | 2/2013 | Chen |
| 8,468,417 B2 | 6/2013 | Asnaashari et al. |
| 8,572,455 B2 | 10/2013 | Blackmon et al. |
| 2004/0237023 A1 * | 11/2004 | Takahashi et al. ............ 714/768 |
| 2006/0069977 A1 * | 3/2006 | Maeda et al. .................. 714/752 |
| 2006/0107130 A1 * | 5/2006 | Baker et al. .................... 714/710 |
| 2006/0195651 A1 * | 8/2006 | Estakhri et al. ................ 711/103 |
| 2007/0076028 A1 * | 4/2007 | Ode ................................... 347/9 |
| 2009/0241010 A1 * | 9/2009 | Yano et al. ..................... 714/764 |
| 2010/0100763 A1 * | 4/2010 | Chen ................................. 714/6 |
| 2010/0211852 A1 | 8/2010 | Lee et al. |
| 2010/0251075 A1 | 9/2010 | Takahashi et al. |
| 2011/0047437 A1 * | 2/2011 | Flynn ............................. 714/758 |
| 2011/0047440 A1 * | 2/2011 | Blackmon et al. ............. 714/764 |
| 2011/0125975 A1 * | 5/2011 | Kim et al. ...................... 711/157 |

\* cited by examiner

MEMORY SYSTEM AND OPERATION METHOD THEREOF

CROSS-REFERENCE TO RELATED APPLICATIONS/INCORPORATION BY REFERENCE

The present application is a continuation application of U.S. patent application Ser. No. 13/328,399 filed on Dec. 16, 2011, which claims priority to and benefit from Japanese Priority Patent Application JP 2011-012544 filed in the Japan Patent Office on Jan. 25, 2011. The entire contents of each of which are incorporated herein by reference.

BACKGROUND

The present disclosure relates to a memory system making use of a non-volatile memory and relates to an operation method of such a memory system.

In the past, there has been used a memory system (also referred to as a storage system) which reads out programs, data and the like from a memory functioning as a storage device (also referred to as an auxiliary storage apparatus) into a work memory (also referred to as a main storage apparatus) implemented by typically a DRAM (Dynamic Random Access Memory) in an operation called a loading operation. In this memory system, an NVM (Non-Volatile Memory) is generally used to serve as the storage device which is required to operate at a high speed.

The non-volatile memory can be a flash memory or an NVRAM (Non-Volatile Random Access Memory). The flash memory has a large storage capacity. Data stored in the flash memory is accessed in block units. On the other hand, high-speed random accesses can be made to data stored in the NVRAM in word units. A representative example of the flash memory is a NAND-type flash memory. On the other hand, representative examples of the NVRAM are a PCRAM (Phase-Change Random Access Memory), an MRAM (Magnetoresistive Random Access Memory) and a ReRAM (Resistance Random Access Memory).

Since the flash memory has a low bit cost and a large storage capacity, the flash memory is used in high-speed storage applications. On the other hand, the NVRAM has a high bit cost in comparison with the flash memory. However, the NVRAM has the following merits. The NVRAM has an excellent performance of allowing high-speed accesses to be made in word units. In addition, since a CPU (Central Processing Unit) is capable of making direct accesses to the NVRAM, the NVRAM is used as a non-volatile cache memory for the storage device in order to allow the operation of the memory system to be carried out expectedly at a high speed.

Typical examples of a memory system making use of such a flash memory and such an NVRAM are described in documents such as JP-T-2004-506256 (Patent Document 1) and Japanese Patent Laid-Open No. 2006-236304 as well as Shuhei Tanakamaru and four coauthors, "Post-manufacturing 17-times Acceptable Raw Bit Error Rate Enhancement, Dynamic Codeword Transition ECC scheme for Highly Reliable Solid-State Drives, SSDs," Memory Workshop (IMW), 2010 IEEE International, p. 1-4. The memory system is also referred to as a non-volatile memory system.

SUMMARY

By the way, it is important to improve the data holding characteristic of the non-volatile memory employed in such a memory system and the reliability of the memory system. This is because, as the number of rewrite operations increases, the data holding characteristic of the non-volatile memory employed in the memory system tends to deteriorate. In order to solve this problem, the data holding characteristic of a NAND-type flash memory is improved by typically carrying out bit-error detection and correction processing on data through use of an ECC (Error Correction Code) as described in Patent Document 1.

For example, if the NVRAM described above is used as a non-volatile cache memory, on the other hand, the frequency of accesses to the NVRAM is high in comparison with the storage device which is typically the NAND-type flash memory. It is thus also important to improve the data holding characteristic of the NVRAM. However, the memory system disclosed in Patent Document 1 does not describe a technique for improving the data holding characteristic of the NVRAM by typically making use of ECCs (error correction codes) at all.

For the reason described above, it is possible to think of a technique for improving the data holding characteristic of the NVRAM by applying ECCs to data stored in the NVRAM. By simply applying the ECCs to data stored in the NVRAM, however, there is undesirably generated a side effect that the speed of the access to the NVRAM decreases by a speed difference proportional to the number of accesses to the ECCs or a bad side effect on the NVRAM band. As a result, the operation speed of the entire memory system inevitably decreases.

It is desirable to provide a memory system capable of improving the reliability of the system without decreasing the operation speed and provide an operation method for the memory system.

A memory system according to an embodiment of the present disclosure has: a first non-volatile memory used for storing data to be accessed in block units; a second non-volatile memory used for storing data to be accessed in word units in random accesses to the second non-volatile memory; and a control section configured to control operations of the first and second non-volatile memories.

In the memory system, error correction codes to be applied to data stored in the second non-volatile memory are held in the first non-volatile memory.

An operation method for a memory system according to another embodiment of the present disclosure includes: performing accesses made in block units to data stored in a first non-volatile memory employed in the memory system; performing random accesses made in word units to data stored in a second non-volatile memory employed in the memory system; and carrying out bit-error detection and correction processing on the data stored in the second non-volatile memory by making use of error correction codes held in the first non-volatile memory.

In accordance with the memory system according to the embodiment of the present disclosure and the operation method for the memory system, accesses are made in block units to data stored in the first non-volatile memory whereas random accesses are made in word units to data stored in the second non-volatile memory. At that time, the error correction codes held in the first non-volatile memory are applied to the data stored in the second non-volatile memory typically in order to carry out bit-error detection and correction processing on the data stored in the second non-volatile memory so as to improve the data holding characteristic of the second non-volatile memory. In addition, by holding the error correction codes in the first non-volatile memory it is possible to prevent the speed of the access to the second non-volatile memory from decreasing as is the case with a configuration in which the error correction codes are typically held in the second non-volatile memory itself.

In addition, in accordance with the memory system according to the embodiment of the present disclosure and the operation method for the memory system, the error correction codes to be applied to the data stored in the second non-volatile memory and subjected to random accesses in word units are held in the first non-volatile memory used for storing data to be accessed in block units. Thus, it is possible to improve the data holding characteristic of the second non-volatile memory while preventing the speed of the access to the second non-volatile memory from decreasing. As a result, the reliability of the system can be improved without decreasing the operation speed.

DETAILED DESCRIPTION

An embodiment of the present disclosure is explained below in detail by referring to the diagrams. It is to be noted that the description is divided into the following chapters.

1: Embodiment (Typical configuration of using a NAND-type flash memory as a first non-volatile memory)

2: Typical Modifications

First Typical Modification (Typical configuration with a NAND-type flash memory including an embedded ECC processing section)

Second Typical Modification (Typical configuration of using an MFD as a first non-volatile memory)

Other Typical Modifications

Embodiment

Configuration of a Data Storage System 1

Figure 1:
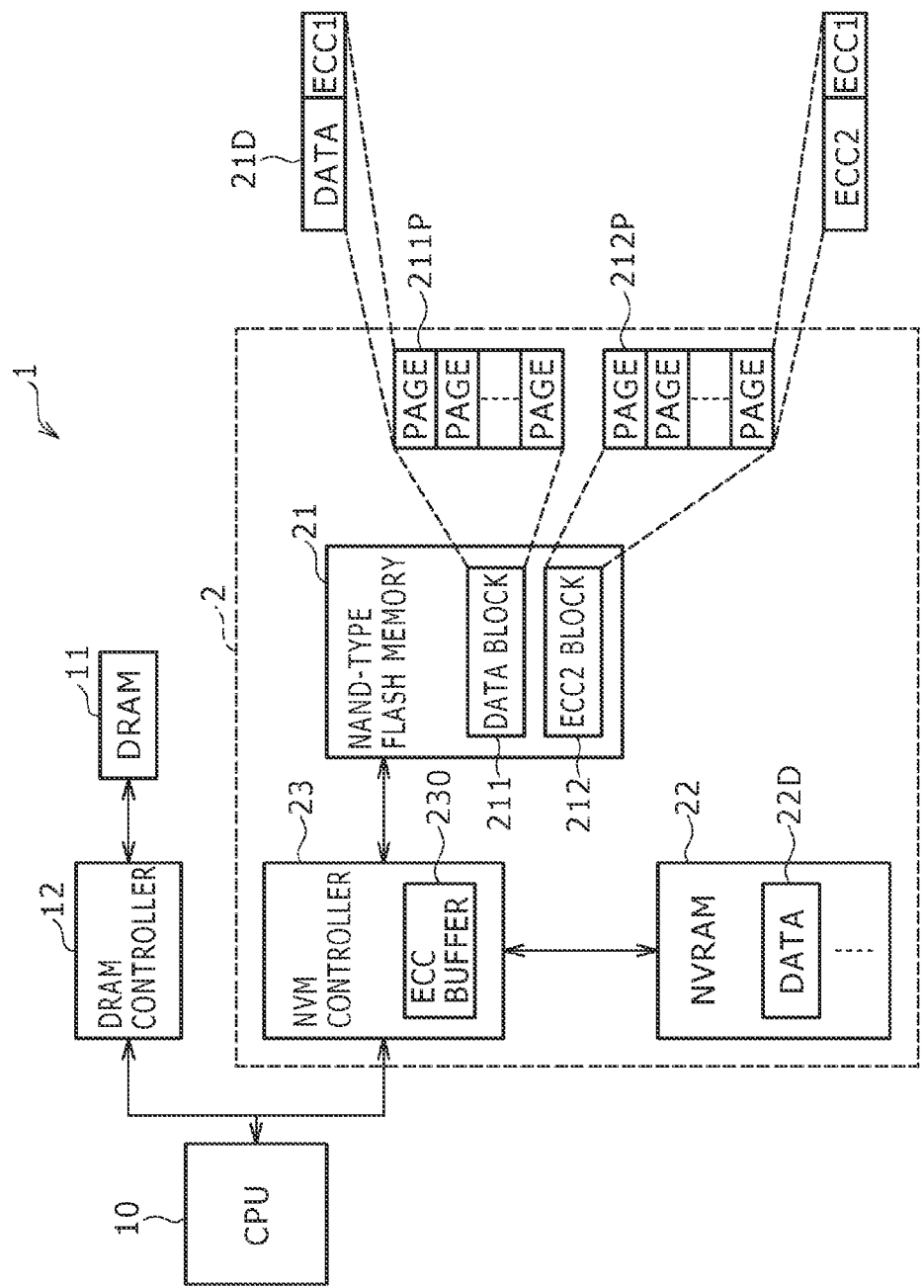
FIG. 1 is a block diagram showing a typical configuration of a data storage system including a non-volatile memory system according to an embodiment of the present disclosure.

FIG. 1 is a block diagram showing a typical configuration of a data storage system 1 including a non-volatile memory system 2 according to an embodiment of the present disclosure. As shown in the figure, the data storage system 1 employs a CPU 10, a DRAM 11, a DRAM controller 12 and the non-volatile memory system 2 according to the embodiment of the present disclosure.

The CPU 10 controls operations of the DRAM 11, the DRAM controller 12 and the non-volatile memory system 2. To put it concretely, the CPU 10 makes accesses to data held (or stored) in an NVRAM 22 and a NAND-type flash memory 21 through an NVM controller 23 to be described later. The CPU 10 then loads the data into the DRAM 11 functioning typically as a work memory also referred to as a main memory. Conversely, the CPU 10 writes data stored in the DRAM 11 into the non-volatile memory system 2.

The DRAM 11 is a volatile memory functioning as a work memory in the data storage system 1 as described above. The DRAM controller 12 is a section for controlling operations of the DRAM 11 in accordance with a command received from the CPU 10. Typical operations of the DRAM 11 include an operation to write data into the DRAM 11 and an operation to read out data from the DRAM 11.

Configuration of the Non-Volatile Memory System 2

The non-volatile memory system 2 employs the NAND-type flash memory 21, the NVRAM 22 and the NVM controller 23. Also referred to as a first non-volatile memory, the NAND-type flash memory 21 is an NVM (a non-volatile memory). The NVRAM 22 is also referred to as a second non-volatile memory. The NVM controller 23 serves as a control section. It is the NAND-type flash memory 21 that functions as a storage device. On the other hand, the NVRAM 22 functions as a work memory and/or a non-volatile cache memory. Thus, the non-volatile memory system 2 can be said to be an SnD (Store and Download) model serving as a combination with the NAND-type flash memory 21 and an XIP (eXecute In Plane) model serving as a combination with the NVRAM 22.

NAND-Type Flash Memory 21

The NAND-type flash memory 21 is a non-volatile memory such as a flash memory. Data stored in the NAND-type flash memory 21 is accessed in block units. In this case, the block units are pages 211P and pages 212P. The pages 211P and the pages 212P will be described later. The NAND-type flash memory 21 has a data block 211 and an ECC2 block 212.

The data block 211 is a data area referred to as a block used for holding (or storing) data 21D in page-211P units. To put it concretely, on each page 211P, the data 21D is held with an error correction code ECC1 used for correcting the data 21D. The error correction code ECC1 is also referred to as a first error correction code. That is to say, as described later, the error correction code ECC1 is a code to be applied to data 21D stored in the NAND-type flash memory 21. Thus, the error correction code ECC1 is a code used for improving the characteristic of holding data in the NAND-type flash memory 21.

The ECC2 block 212 is a data area referred to as a block used for holding (or storing) error correction codes ECC2 each referred to as a second error correction code in page-212P units. The error correction codes ECC2 are used for protecting the NVRAM 22. That is to say, in this embodiment, the error correction codes ECC2 to be applied to the NVRAM 22 are also stored in the NAND-type flash memory 21. To put it concretely, on each page 212P, error correction codes ECC2 are held with an error correction code ECC1 described above.

Figure 2:
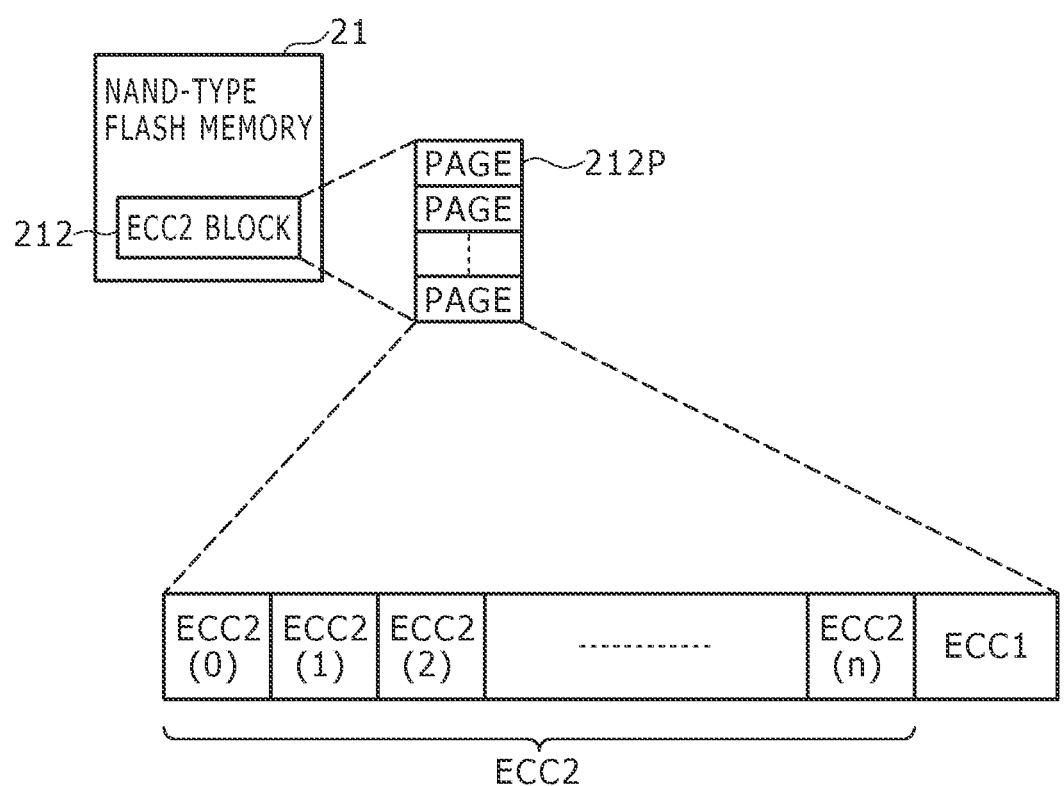
FIG. 2 is a block diagram showing a typical detailed data structure of an ECC2 block in a NAND-type flash memory shown in FIG. 1.

To put it in detail, as shown in FIG. 2 for example, a batch composed of a plurality of error correction codes ECC2 is stored on each page 212P with an error correction code ECC1. The batch of a plurality of error correction codes ECC2 is a batch created by collecting ECC2 (0) to ECC2 (n) where n is an integer equal to or greater than 2. In other words, each page 212P is used for holding a plurality of error correction codes ECC2 in a data area and an error correction code ECC1 in a redundant area in the same way as the page 211P.

It is to be noted that, if an access to the NVRAM 22 is a 32-bit access for example, the error correction code ECC2 required for protecting data stored in the NVRAM 22 has a length of 6 bits. A typical example of the error correction code ECC2 is the hamming code. In addition, let the size of the data area of the pages 211P and 212P in the NAND-type flash memory 21 be about 32 Kbits (or about 4 Kbytes) which are the value of an ordinary size. In this case, the error correction codes ECC2 for data having a size of about 5 Kwords in the NVRAM 22 are held in a page 212P. In addition, in this case, the NVM controller 23 is capable of reading out error correction codes ECC2 having a size of about 5 Kwords from the NAND-type flash memory 21 to an ECC buffer 230 in one access as described later. Thus, the time it takes to read out one page from the NAND-type flash memory 21 is about 80 microseconds in the case of an MLC NAND-type flash memory used for an ONFI 2.1 mode 5 (200 MB/second) or 16 ns per error correction code ECC2. Therefore, even in the case of an access made to consecutive addresses in the NVRAM 22, if the time of the access to the NVRAM 22 is longer than 16 ns, in the continuation of the access, error correction codes ECC2 for the next page can be read out from the NAND-type flash memory 21 to the ECC buffer 230. It is to be noted that, if accesses are made to non-consecutive addresses in the NVRAM 22, by making use of a prefetch function to be described later, the time it takes to read out error correction codes ECC2 from the NAND-type flash memory 21 to the ECC buffer 230 can be shortened. It is also worth noting that, as the time of an access to the NVRAM 22, the access time of about 16 ns cited above can be said to be a sufficiently short value in general.

NVRAM 22

The NVRAM 22 is a non-volatile memory to which random accesses are made in order to read out data 22D from the memory in word units. Unlike the NAND-type flash memory 21 described above, the NVRAM 22 is used for storing only the data 22D. That is to say, no error correction codes are held in the NVRAM 22. Typical examples of the NVRAM 22 include a PCRAM, an MRAM and an ReRAM.

NVM Controller 23

The NVM controller 23 is a section for controlling operations of the NAND-type flash memory 21 and the NVRAM 22 in accordance with a command received from the CPU 10. Typical operations of the NAND-type flash memory 21 include an operation to write data 21D into the NAND-type flash memory 21 and an operation to read out data 21D from the NAND-type flash memory 21. By the same token, typical operations of the NVRAM 22 include an operation to write data 22D into the NVRAM 22 and an operation to read out data 22D from the NVRAM 22. The NVM controller 23 is configured to include the ECC buffer 230 mentioned above.

In this embodiment, the NVM controller 23 has a function to carry out processing to detect and correct bit errors determined in advance by making use of the error correction codes ECC1 and ECC2 held in the NAND-type flash memory 21. The processing to detect and correct bit errors is referred to as bit-error detection and correction processing. To put it concretely, in an operation to write data 21D into the NAND-type flash memory 21, an error correction code ECC1 is added to the data 21D. In an operation to read out data 21D from the NAND-type flash memory 21 or at a system activation time, on the other hand, the bit-error detection and correction processing making use of an error correction code ECC1 is carried out on the data 21D. In addition, in an operation to write data 22D into the NVRAM 22, error correction code generation processing is carried out on the data 22D by making use of error correction codes ECC2. In an operation to read out data 22D from the NVRAM 22 or at a system activation time, on the other hand, the bit-error detection and correction processing making use of an error correction codes ECC2 is carried out on the data 22D.

On top of that, the NVM controller 23 carries out processing to compute an error correction code ECC1 for each page 211P used as the unit of an access to the data 21D concurrently with processing to compute an error correction code ECC2 for each word used as the unit of an access to the data 22D. It is to be noted that details of the bit-error detection and correction processing making use of these error correction codes ECC1 and ECC2 will be described later by referring to FIGS. 6 to 8.

As described above, the NVM controller 23 is configured to include the ECC buffer 230 used as a buffer area for temporarily holding an ECC2 block 212 read out (or loaded) from the NAND-type flash memory 21. Then, as will be described later in detail, the NVM controller 23 makes use of the error correction codes ECC2 in the ECC buffer 230 to carry out the bit-error detection and correction processing. Thus, the bit-error detection and correction processing can be carried out at a high speed.

In addition, when error correction codes ECC2 are read out from the NAND-type flash memory 21 to the ECC buffer 230 by making use of the aforementioned batch composed of a plurality of error correction codes ECC2 as a read unit, by associating the error correction codes ECC2 with consecutive addresses in the NVRAM 22, the bit-error detection and correction processing can be carried out at a high speed in accesses to the consecutive addresses in the NVRAM 22. In this way, the NVM controller 23 is capable of implementing a caching function of the error correction codes ECC1 and ECC2 by making use of the ECC buffer 230.

In addition, the NVM controller 23 has an ECC-page management function for managing ECC pages by associating addresses of the data 22D in the NVRAM 22 with addresses at which the error correction codes ECC2 for the data 22D are held in the NAND-type flash memory 21. It is to be noted that details of the bit-error detection and correction processing making use of this ECC-page management function will also be described later by referring to FIGS. 6 to 8.

Figure 3:
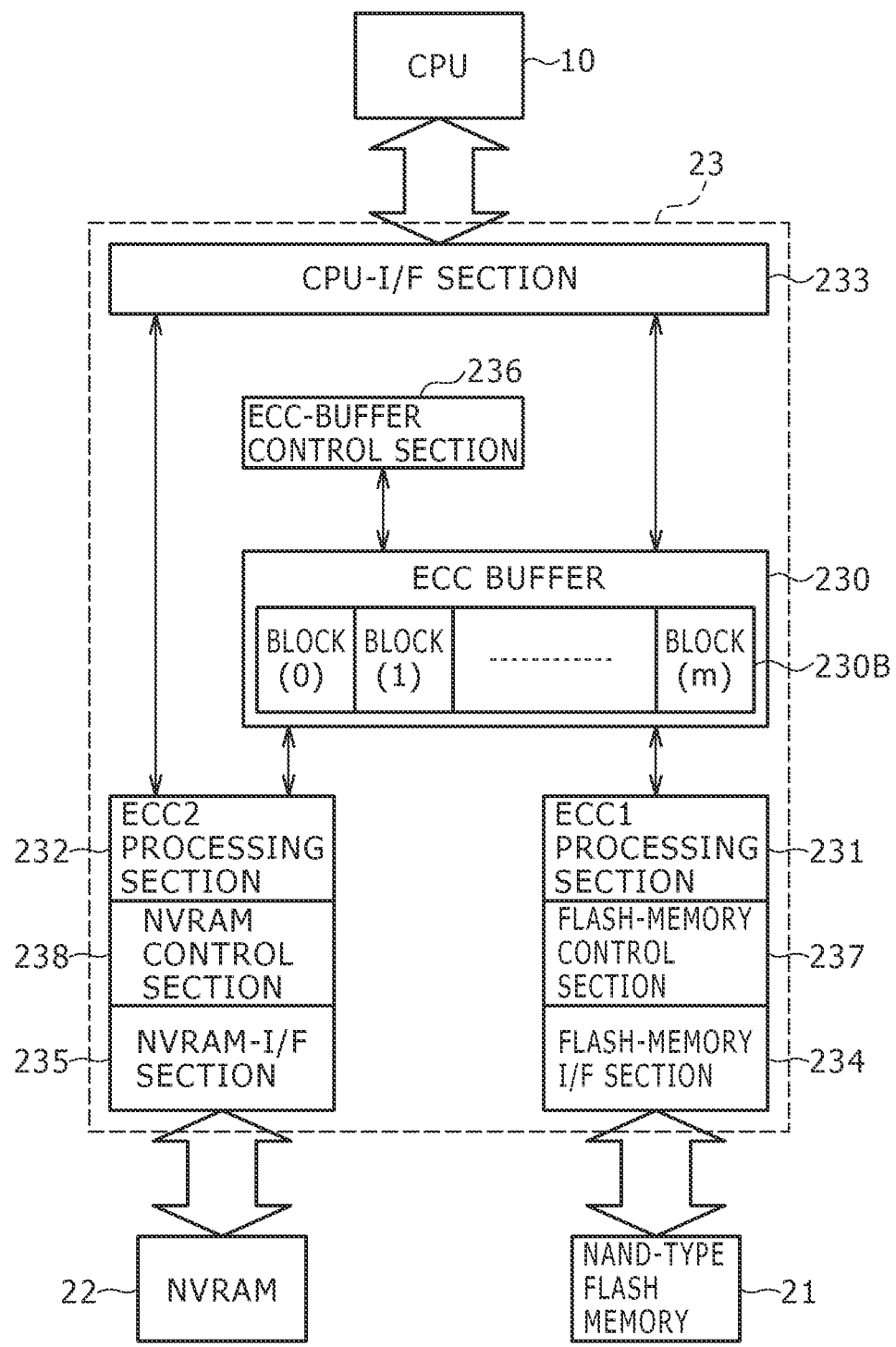
FIG. 3 is a block diagram showing a typical detailed data configuration of an NVM controller shown in FIG. 1.

FIG. 3 is a block diagram showing a typical detailed data configuration of the NVM controller 23. As shown in the figure, the NVM controller 23 employs an ECC1 processing section 231, an ECC2 processing section 232, a CPU-I/F section 233, a flash-memory I/F section 234, an NVRAM-I/F section 235, an ECC-buffer control section 236, a flash-memory control section 237 and an NVRAM control section 238 in addition to the ECC buffer 230 described above.

The ECC1 processing section 231 is a section for carrying out the bit-error detection and correction processing on the data 21D in the NAND-type flash memory 21 by making use of an error correction code ECC1. It is to be noted that the result of the bit-error detection and correction processing carried out on the data 21D stored in an ECC2 block 212 is temporarily stored in the ECC buffer 230. In addition, the data 21D in a data block 211 other than the ECC2 block 212 is output from the NVM controller 23 by way of the CPU-I/F section 233.

The ECC2 processing section 232 is a section for carrying out the bit-error detection and correction processing on the data 22D in the NVRAM 22 by making use of an error correction code ECC2 temporarily held in the ECC buffer 230. It is to be noted that the bit-error detection and correction processing making use of error correction codes ECC2 is carried out by adoption of typically the commonly taken hamming code method.

The CPU-I/F section 233 is an interface (I/F) for establishing a connection between the NVM controller 23 and the CPU 10. The flash-memory I/F section 234 is an interface (I/F) for establishing a connection between the NVM controller 23 and the NAND-type flash memory 21. The NVRAM-I/F section 235 is an interface (I/F) for establishing a connection between the NVM controller 23 and the NVRAM 22. As described above, the NVM controller 23 has the NVRAM-I/F section 235 serving as an I/F between the NVM controller 23 and the NVRAM 22 used as a work memory to which random accesses are made in word units. In addition, the NVM controller 23 also has the flash-memory I/F section 234 serving as an I/F between the NVM controller 23 and the NAND-type flash memory 21 used as a storage device to which accesses are made in block (or page) units.

The ECC-buffer control section 236 is a section for controlling operations carried out by the ECC buffer 230. The flash-memory control section 237 is a section for controlling operations carried out by the ECC1 processing section 231 and the flash-memory I/F section 234. On the other hand, the NVRAM control section 238 is a section for controlling operations carried out by the ECC2 processing section 232 and the NVRAM-I/F section 235.

Effects of the Data Storage System 1

1: Basic Operations

In the data storage system 1, the DRAM controller 12 is controlled in accordance with a command issued by the CPU 10 in order to drive the DRAM 11 to function as a work memory of the data storage system 1. By the same token, the NVM controller 23 is controlled in accordance with a command issued by the CPU 10 in order to drive the NVRAM 22 to function as a work memory of the non-volatile memory system 2 and drive the NAND-type flash memory 21 to function as a storage device of the non-volatile memory system 2. Thus, in accordance with a command issued by the CPU 10, a program determined in advance is executed and/or processing determined in advance is carried out. At that time, in the non-volatile memory system 2, accesses to the data 21D stored in the NAND-type flash memory 21 are made in block (or page) units whereas random accesses to the data 22D stored in the NVRAM 22 are made in word units.

In addition, at that time, the NVM controller 23 makes use of an error correction code ECC1 held in the NAND-type flash memory 21 in order to carry out the bit-error detection and correction processing on the data 21D stored in the NAND-type flash memory 21. To put it concretely, the NVM controller 23 makes use of an error correction code ECC1 generated in an operation to write the data 21D into the NAND-type flash memory 21 in order to carry out the bit-error detection and correction processing on the data 21D stored in the NAND-type flash memory 21 by applying the error correction code ECC1 to the data 21D in an operation to read out the data 21D from the NAND-type flash memory 21 or at a system activation time, that is, a time at which the non-volatile memory system 2 is activated. It is to be noted that the bit-error detection and correction processing making use of error correction codes ECC2 is carried out by adoption of typically the commonly taken BCH code method. Thus, it is possible to improve the characteristic of holding the data 21D in the NAND-type flash memory 21 and enhance the reliability of the non-volatile memory system 2.

2: Bit-Error Detection and Correction Processing Using Error Correction Codes ECC2

Next, by referring to FIGS. 4 to 8, the following description explains details of bit-error detection and correction processing carried out by making use of error correction codes ECC2 as processing serving as one of characteristics of the present disclosure by comparing the bit-error detection and correction processing with processing carried out by first and second typical comparison systems.

2-1: First Typical Comparison System

Figure 4:
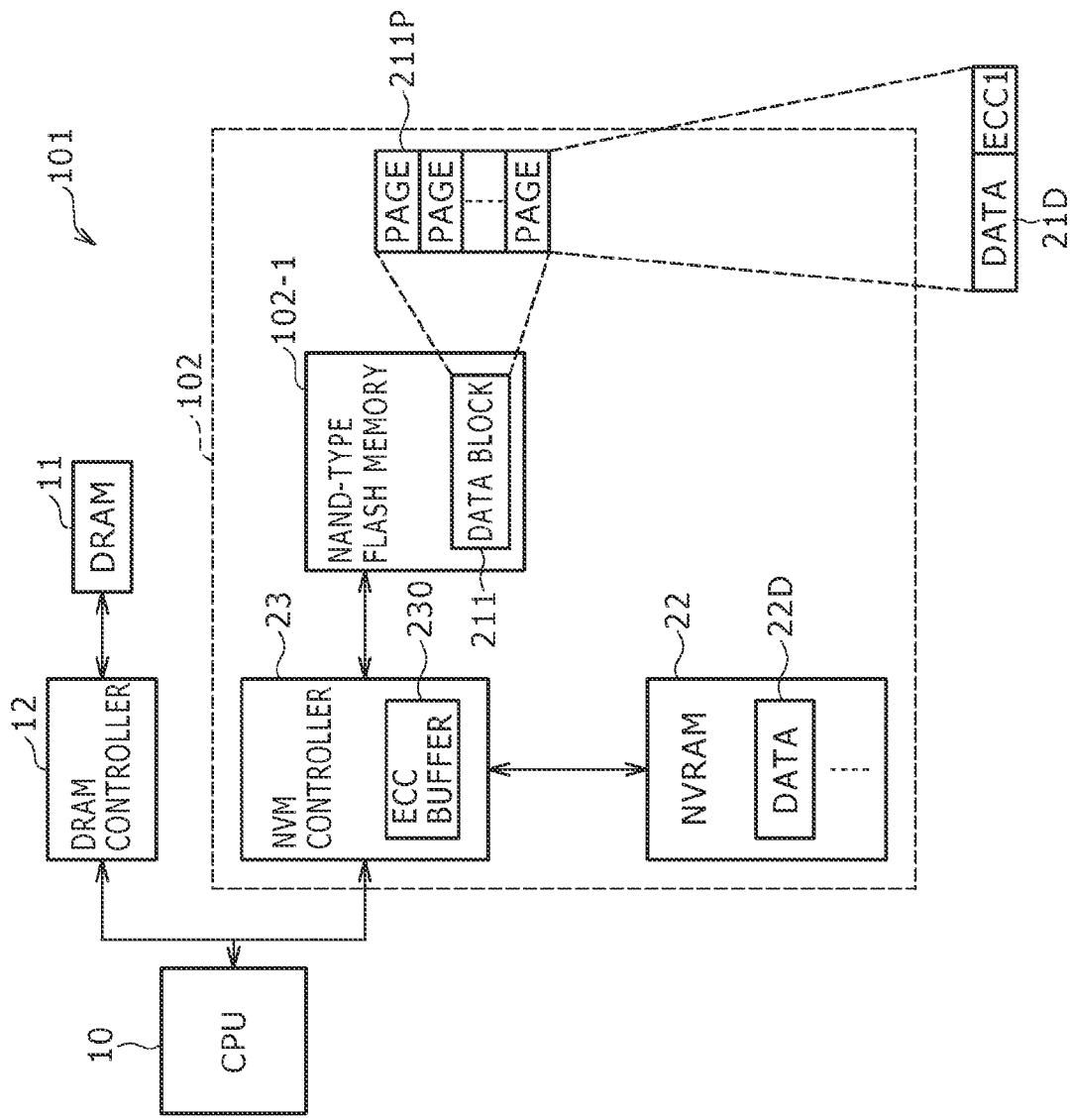
FIG. 4 is a block diagram showing the configuration of a data storage system including a memory system serving as a first typical comparison system.

FIG. 4 is a block diagram showing the configuration of a data storage system 101 including a non-volatile memory system 102 serving as a first typical comparison system. As shown in the figure, the data storage system 101 employs a CPU 10, a DRAM 11, a DRAM controller 12 and the non-volatile memory system 102 serving as a first typical comparison system. As is obvious from comparison of the configuration shown in FIG. 1 with the configuration shown in FIG. 4, in place of the non-volatile memory system 2 employed in the data storage system 1 according to the embodiment to serve as a non-volatile memory system 2 according to the embodiment, the data storage system 101 includes the non-volatile memory system 102 serving as a first typical comparison system. Otherwise, the configuration of the data storage system 101 serving as a first typical comparison system is identical with the configuration of the data storage system 1 according to the embodiment.

Unlike the non-volatile memory system 2 according to the embodiment, however, the non-volatile memory system 102 serving as a first typical comparison system does not include the ECC2 block 212 because the error correction codes ECC2 do not exist in a NAND-type flash memory 102-1 employed in the non-volatile memory system 102. Otherwise, the configuration of the non-volatile memory system 102 serving as a first typical comparison system is identical with the configuration of the non-volatile memory system 2 according to the embodiment.

That is to say, in the non-volatile memory system 102, error correction codes ECC1 are used to improve the data holding characteristic of the NAND-type flash memory 102-1 itself in the same way as the non-volatile memory system 2 according to the embodiment. Unlike the non-volatile memory system 2 according to the embodiment, however, the non-volatile memory system 102 serving as a first typical comparison system does not make use of the error correction codes ECC2 for the NVRAM 22.

Thus, since the first typical comparison system does not carry out the bit-error detection and correction processing on the data 22D stored in the NVRAM 22 by making use of the error correction codes ECC2, it is quite within the bounds of possibility that a data error is generated when the NVRAM 22 deteriorates due to a large number rewrite count representing the number of rewrite operations carried out on the NVRAM 22. In particular, if the NVRAM 22 is used as a non-volatile cache memory, the number of accesses to the NVRAM 22 is large in comparison with the number of accesses to the NAND-type flash memory 102-1 serving as a storage device. Thus, the NVRAM 22 is required to have a data holding characteristic not worse than that of the NAND-type flash memory 102-1. In the first typical comparison system, however, generation of a data error in the NVRAM 22 cannot be avoided. Thus, the reliability of the entire non-volatile memory system 102 serving as the first typical comparison system inevitably deteriorates.

2-2: Second Typical Comparison System

Figure 5:
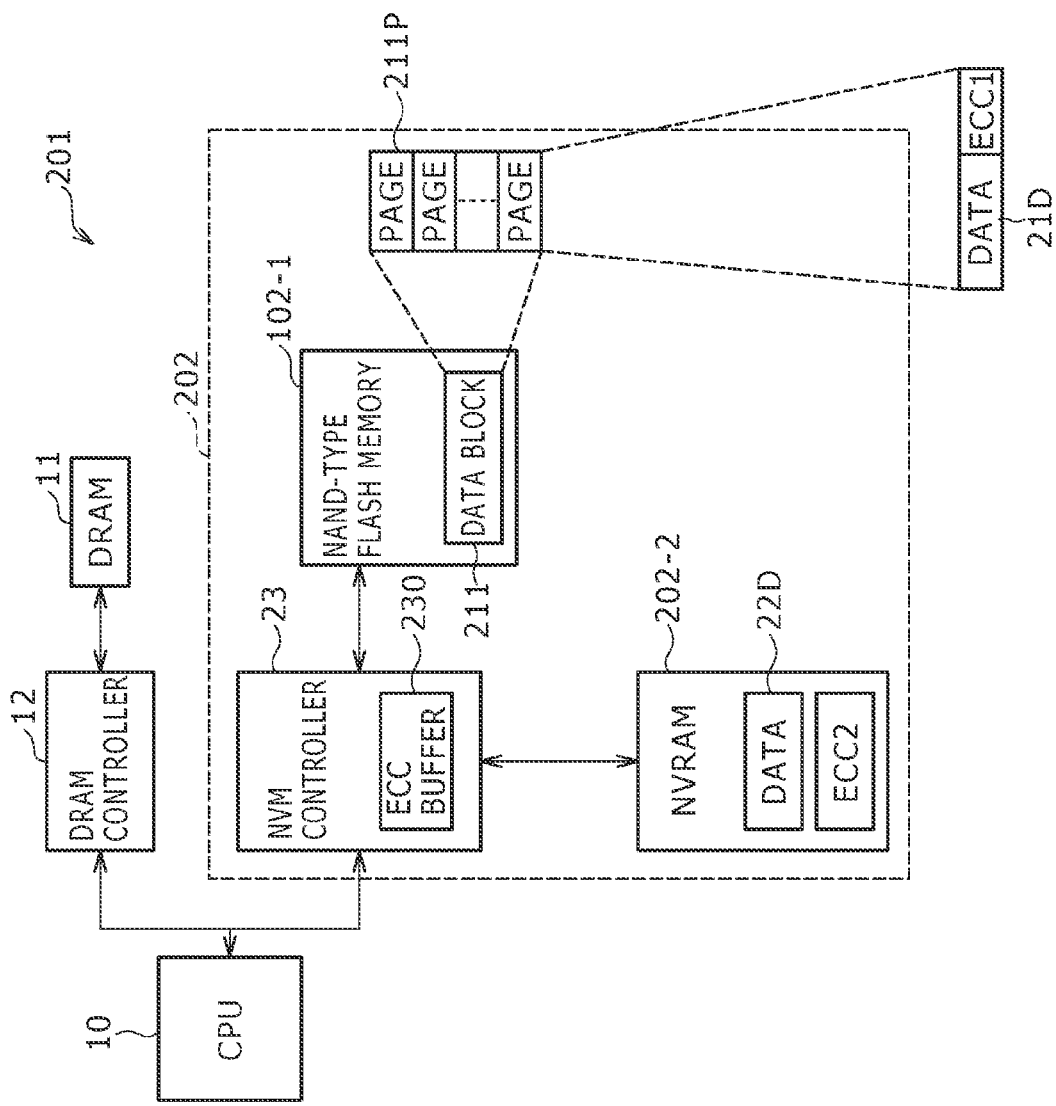
FIG. 5 is a block diagram showing the configuration of a data storage system including a memory system serving as a second typical comparison system.

FIG. 5 is a block diagram showing the configuration of a data storage system 201 including a memory system 202 serving as a second typical comparison system. As shown in the figure, the data storage system 201 employs a CPU 10, a DRAM 11, a DRAM controller 12 and the non-volatile memory system 202 serving as a second typical comparison system. As is obvious from comparison of the configuration shown in FIG. 1 with the configuration shown in FIG. 5, in place of the non-volatile memory system 2 employed in the data storage system 1 according to the embodiment to serve as a non-volatile memory system 2 according to the embodiment, the data storage system 201 includes the non-volatile memory system 202 serving as a second typical comparison system. Otherwise, the configuration of the data storage system 201 serving as a second typical comparison system is identical with the configuration of the data storage system 1 according to the embodiment.

Unlike the non-volatile memory system 2 according to the embodiment, however, the non-volatile memory system 202 serving as a second typical comparison system does not include the ECC2 block 212 because the error correction codes ECC2 do not exist in a NAND-type flash memory 102-1 employed in the non-volatile memory system 202. Instead, in the non-volatile memory system 202, an NVRAM 202-2 is provided with an area used for storing the error correction codes ECC2. Otherwise, the configuration of the non-volatile memory system 202 serving as a second typical comparison system is identical with the configuration of the non-volatile memory system 2 according to the embodiment.

That is to say, the bit-error detection and correction processing making use of the error correction codes ECC2 is carried out on the data 22D stored in the NVRAM 202-2. Thus, in comparison with the first typical comparison system, the characteristic of holding the data 22D in the NVRAM 202-2 is improved. As a result, the reliability of the entire non-volatile memory system 202 is also improved as well.

In the non-volatile memory system 202 serving as a second typical comparison system, however, the following problems are inevitably raised due to the fact that the error correction codes ECC2 for the NVRAM 202-2 are stored in the NVRAM 202-2 itself.

Problem of a Reduced Access Speed

In the first place, the speed of the access to the NVRAM 202-2 is undesirably reduced as a side effect which is a negative effect on the band of the NVRAM 202-2. Thus, the speed of the operation of the entire non-volatile memory system 202 inevitably decreases. In a system in which the error correction codes ECC2 are stored in the NVRAM 202-2 as is the case with the second typical comparison system, as described below, there are two conceivable techniques for making accesses to the non-volatile memory system 202.

In accordance with the first technique, as shown in FIG. 5, the error correction codes ECC2 are held at an address different from an address at which the data 22D is stored in the NVRAM 202-2. In accordance with this technique, as an access to the NVRAM 202-2, in actuality, it is necessary to make at least two accesses. The first access is an access to the data 22D whereas the second access is an access to the error correction code ECC2. Thus, in accordance with the first technique, the high speed of the access to the NVRAM 202-2 is inevitably reduced to ½.

In accordance with the second technique, in the NVRAM 202-2, error correction codes ECC2 are held in some bits included in the data 22D as bits allocated to the error correction codes ECC2. In accordance with this technique, both the data 22D and the error correction codes ECC2 assigned thereto can be accessed in one access to the NVRAM 202-2. Thus, in comparison with the first technique described above, the effect of the reduced speed of the access to the NVRAM 202-2 tends to decrease. Since the bit size of the data 22D used in the one access decreases by a difference corresponding to some bits included in the data 22D as bits allocated to the error correction codes ECC2 as described above, however, also in the case of the second technique, the high speed of the access to the NVRAM 202-2 is inevitably reduced. It is to be noted that, if 8 of 16 bits of the data 22D are allocated to the error correction codes ECC2 in the case of the second technique for example, in the end, the speed of the access to the NVRAM 202-2 is inevitably reduced to ½ as is the case with the first technique described above.

As described above, in either of the two techniques described above as techniques for the second typical comparison system, the speed of the access to the NVRAM 202-2 is inevitably reduced and, thus, the speed of the operation of the entire non-volatile memory system 202 undesirably decreases.

Problem of a Rising Cost

In the second place, if the NAND-type flash memory 102-1 and the NVRAM 202-2 are used as the two non-volatile memories in particular, the non-volatile memory system 202 serving as the second typical comparison system raises a problem caused by a rising cost as follows. In general, the bit unit cost of the NVRAM is high in comparison with the NAND-type flash memory. Thus, if the error correction codes ECC2 for the NVRAM 202-2 are held in the NVRAM 202-2 itself as is the case with the second typical comparison system, the actual data storage capacity of the NVRAM 202-2 decreases. Thus, the nonvolatile-memory cost of the entire non-volatile memory system 202 undesirably increases.

2-3: Embodiment of the Disclosure

In the case of the non-volatile memory system 2 according to the embodiment, on the other hand, the error correction codes ECC2 held in the NAND-type flash memory 21 are applied to the data 22D stored in the NVRAM 22 as explained earlier by referring to FIGS. 1 to 3 in order to carry out the bit-error detection and correction processing described below in detail on the data 22D. Thus, in comparison with the non-volatile memory system 102 used as the first typical comparison system described above, the data holding characteristic of the NVRAM 22 is improved.

In addition, in the case of the embodiment, the error correction codes ECC2 are held in the NAND-type flash memory 21 as explained earlier by referring to FIGS. 1 and 2. Thus, unlike the second typical comparison system in which the error correction codes ECC2 are held in the NVRAM 202-2, the embodiment is capable of getting rid of the problem described above as the problem of the reduced speed of the access to the NVRAM 22. To put it concretely, since only the data 22D is stored in the NVRAM 22, the efficiency of the utilization of the storage capacity of the NVRAM 22 can be sustained. In addition, since the band of the NVRAM-I/F section 235 is used for all transfers of data, the band does not decrease due to the use of the error correction codes ECC2. Thus, the effect on the performance of the NVRAM 22 can be reduced to a minimum. On top of that, as explained earlier, in an operation to read out the error correction codes ECC2 from the NAND-type flash memory 21 to the ECC buffer 230 by taking a batch composed of a plurality of error correction codes ECC2 as the read unit, the following merits are also obtained. By associating the error correction codes ECC2 with consecutive addresses in the NVRAM 22, the bit-error detection and correction processing can be carried out at a high speed in accesses to the consecutive addresses in the NVRAM 22. It is to be noted that, as will be described later, if the required error correction codes ECC2 do not exist in the ECC buffer 230, an access to the NAND-type flash memory 21 is made again in order to read out the required error correction codes ECC2. Thus, the performance deteriorates temporarily. Since more frequently accessed error correction codes ECC2 once read out from the NAND-type flash memory 21 to the ECC buffer 230 are kept in the ECC buffer 230 as error correction codes ECC2 taking precedence over the rest of the error correction codes ECC2, however, as a whole, the high-speed data access performance exhibited by the NVRAM 22 can be sustained.

In addition, in the case of this embodiment, as described above, the error correction codes ECC2 are held in the NAND-type flash memory 21 having a relatively low bit cost. Thus, unlike the second typical comparison system, the rising-cost problem mentioned before can be solved. That is to say, the cost of the non-volatile memory system 2 can be suppressed.

Figure 6:
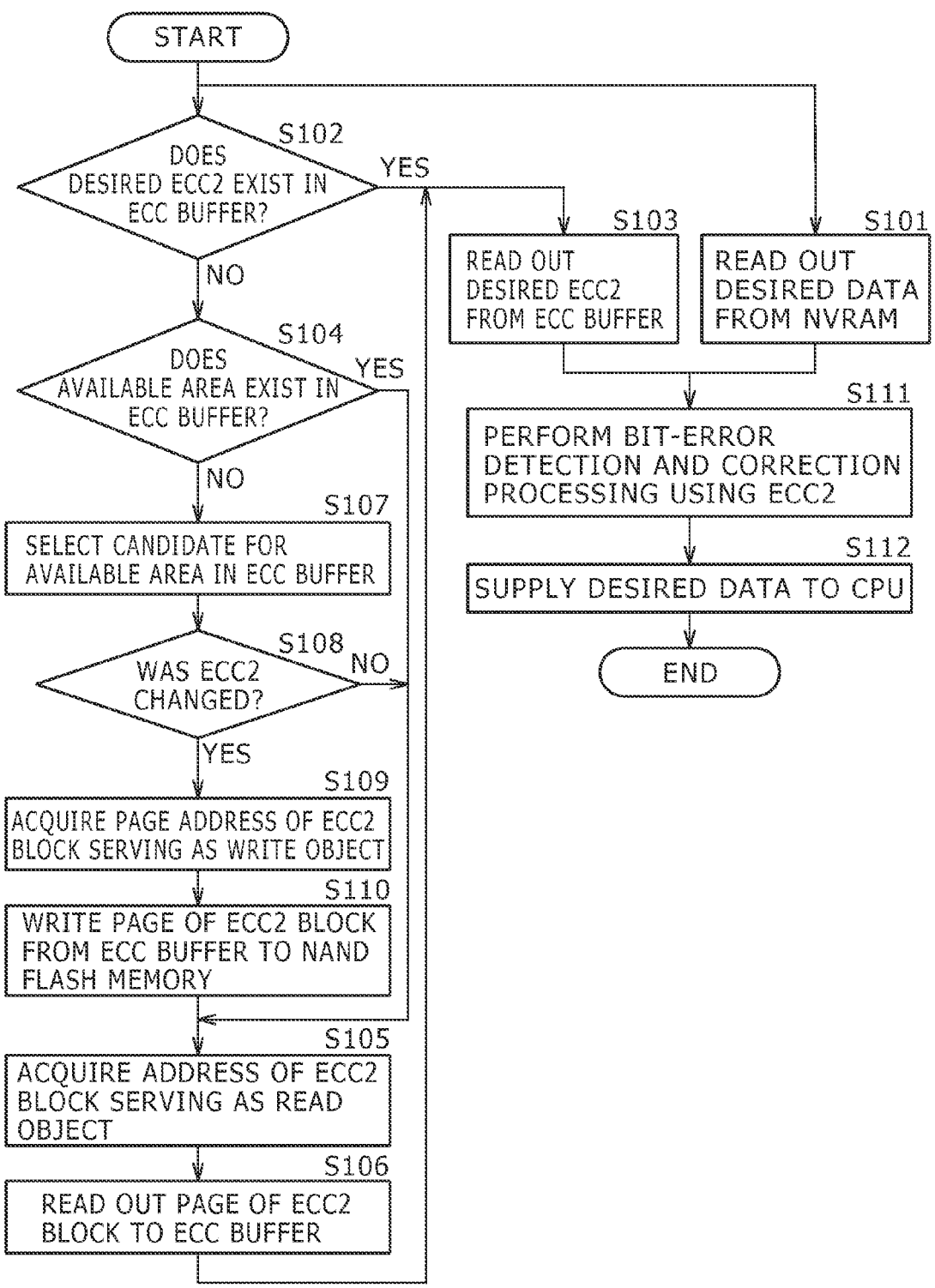
FIG. 6 shows a flowchart representing typical processing to read out data from an NVRAM by making use of error correction codes ECC2.
Figure 7:
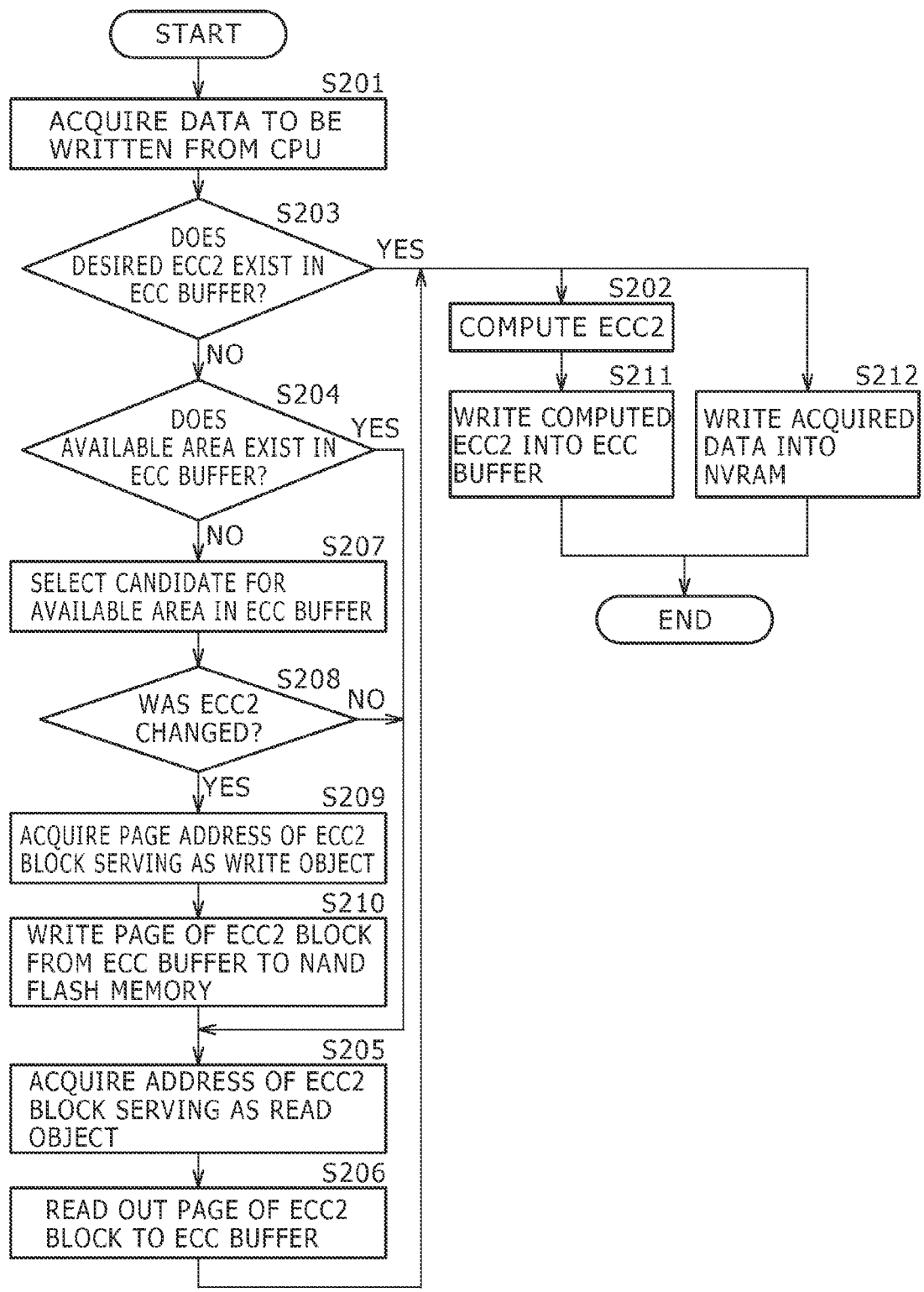
FIG. 7 shows a flowchart representing typical processing to write data into an NVRAM by making use of error correction codes ECC2.
Figure 8:
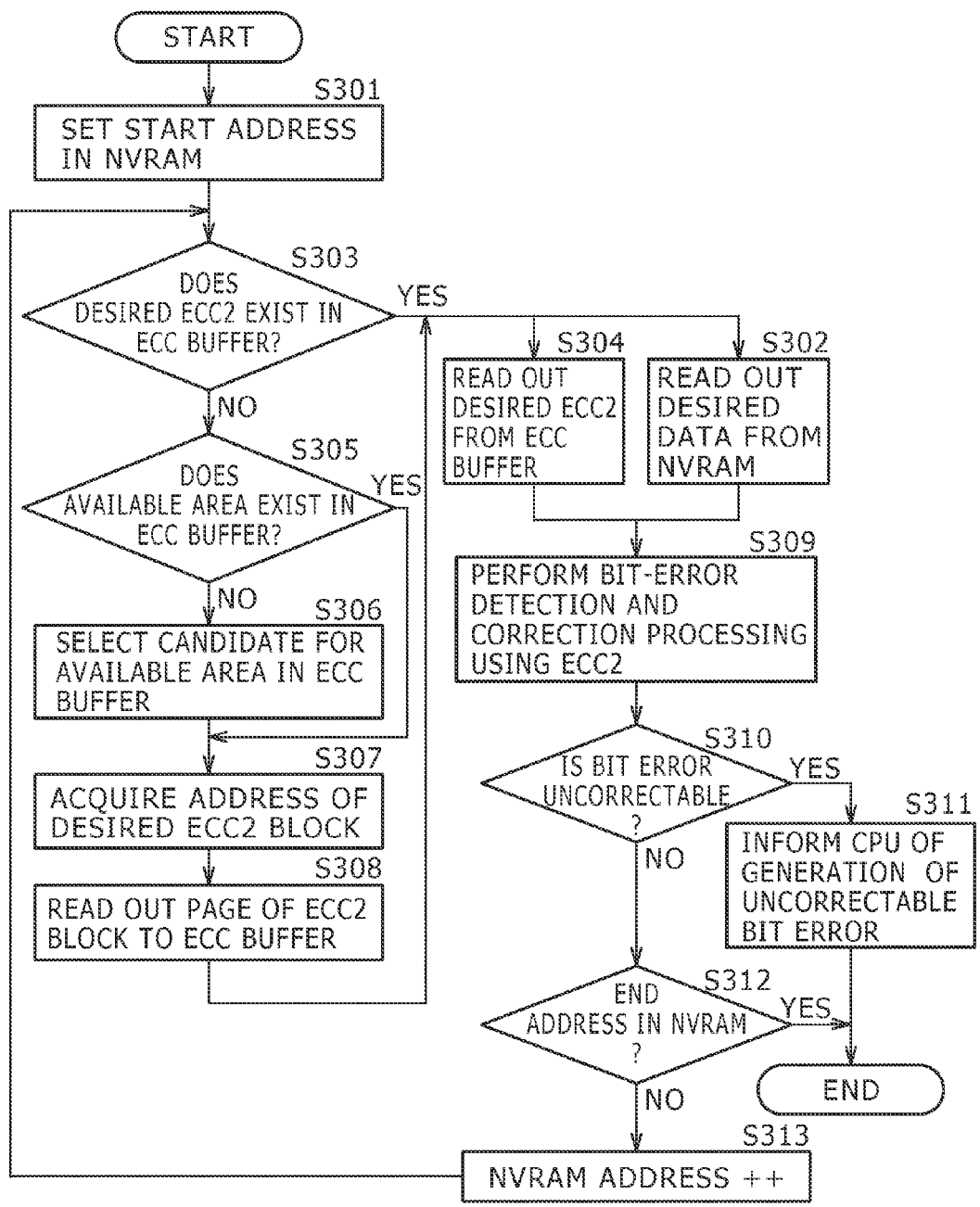
FIG. 8 shows a flowchart representing typical system activation processing making use of error correction codes ECC2.

Next, by referring to FIGS. 6 to 8, the following description explains details of the bit-error detection and correction processing carried out by the NVM controller 23 on the data 22D stored in the NVRAM 22 by making use of such error correction codes ECC2. In other words, as described below, the NVM controller 23 writes the error correction codes ECC2 into the NVRAM 22 when the data 22D is written into the NVRAM 22 and makes use of the error correction codes ECC2 in order to carry out the bit-error detection and correction processing on the data 22D when the data 22D is read out from the NVRAM 22 or at a system activation time.

Processing to Read Out Data from the NVRAM 22

FIG. 6 shows a flowchart representing typical processing to read out data 22D from the NVRAM 22 by making use of the error correction codes ECC2.

As shown in the figure, the flowchart representing the processing to read out the data 22D from the NVRAM 22 begins with a step S101 to be described later and a step S102 at which the NVM controller 23 determines whether or not the error correction code ECC2 corresponding to (or required by) the data 22D to be read out from the NVRAM 22 exists (or is held) in the ECC buffer 230. If the determination result produced at the step S102 is Yes indicating that the error correction code ECC2 corresponding to the data 22D to be read out from the NVRAM 22 exists in the ECC buffer 230, the NVM controller 23 carries out processing as follows. If the determination result cited above is Yes, the flow of the processing goes on to a step S103 at which the NVM controller 23 reads out the error correction code ECC2 from the ECC buffer 230 concurrently with the aforementioned step S101 at which the NVM controller 23 reads out the data 22D serving as a read object from the NVRAM 22.

If the determination result produced at the step S102 is No indicating that the error correction code ECC2 corresponding to the data 22D to be read out from the NVRAM 22 does not exist in the ECC buffer 230, on the other hand, the flow of the processing goes on to a step S104 at which the NVM controller 23 determines whether or not the ECC buffer 230 has (includes) an available area which can be used for holding error correction codes ECC2. The available area is thus an area in which no error correction codes ECC2 have been held. If the determination result produced at the step S104 is Yes indicating that the ECC buffer 230 has (includes) an available area, the flow of the processing goes on to a step S105 at which the NVM controller 23 makes use of the aforementioned ECC-page management function in order to acquire the address of a ECC2 block 212 included in the NAND-type flash memory 21 as a block including the desired error correction code ECC2 not existing (or not held) in the ECC buffer 230. Then, at the next step S106, the NVM controller 23 reads out the ECC2 block 212 including the desired error correction code ECC2 from the NAND-type flash memory 21 to the available area in the ECC buffer 230 and holds the ECC2 block 212 in the available area. Subsequently, the flow of the processing goes on to the step S103 described above. In this way, the NVM controller 23 makes an access to the NVRAM 22 after reading out the ECC2 block 212 including the desired error correction code ECC2 from the NAND-type flash memory 21 to the ECC buffer 230. Thus, for the CPU 10, the time it takes to read out the ECC2 block 212 including the desired error correction codes ECC2 from the NAND-type flash memory 21 to the ECC buffer 230 is an extension of the time it takes to make the access to the NVRAM 22. That is to say, the access to the NVRAM 22 needs to be temporarily suspended while the NVM controller 23 is reading out the ECC2 block 212 including the desired error correction code ECC2 from the NAND-type flash memory 21 to the ECC buffer 230.

If the determination result produced at the step S104 is No indicating that the ECC buffer 230 does not have (include) an available area, on the other hand, the flow of the processing goes on to a step S107 at which the NVM controller 23 selects a candidate for an available area in the ECC buffer 230. To put it concretely, the NVM controller 23 selects an area, which is included in the ECC buffer 230 as an area used for holding error correction codes ECC2 presumably used (or accessed) at a frequency lower than other error correction codes ECC2 (or presumably used or accessed desirably at the lowest frequency among other error correction codes ECC2), as the candidate for an available area in the ECC buffer 230. Then, the NVM controller 23 changes the selected candidate for an available area in the ECC buffer 230 to an available area and newly makes use of the available area as a buffer area.

Then, at the next step S108, the NVM controller 23 determines whether or not the error correction codes ECC2 held in the available area mentioned above have been changed from the corresponding error correction codes ECC2 held in the NAND-type flash memory 21. If the determination result produced at the step S108 is No indicating that the error correction codes ECC2 held in the available area have not been changed from the corresponding error correction codes ECC2 held in the NAND-type flash memory 21, the flow of the processing goes on to the step S105. If the determination result produced at the step S108 is Yes indicating that the error correction codes ECC2 held in the available area have been changed from the corresponding error correction codes ECC2 held in the NAND-type flash memory 21, on the other hand, the corresponding error correction codes ECC2 held in the NAND-type flash memory 21 are updated with the error correction codes ECC2 held in the available area. To put it concretely, if the determination result produced at the step S108 is Yes indicating that the error correction codes ECC2 held in the available area have been changed from the corresponding error correction codes ECC2 held in the NAND-type flash memory 21, the flow of the processing goes on to a step S109 at which the NVM controller 23 makes use of the aforementioned ECC-page management function in order to acquire the address of a page included in the ECC2 block 212 of the NAND-type flash memory 21 as a page used for holding the corresponding error correction codes ECC2. Then, the NVM controller 23 makes use of the page at the acquired address as a write object to which the error correction codes ECC2 held in the available area in the ECC buffer 230 are to be written back to the NAND-type flash memory 21. Then, at the next step S110, the NVM controller 23 writes back the error correction codes ECC2 held in the available area in the ECC buffer 230 to the page in the ECC2 block 212. Subsequently, the flow of the processing goes on to the step S105.

After the steps S103 and S101 explained before have been completed, the flow of the processing goes on to a step S111 at which the NVM controller 23 carries out the bit-error detection and correction processing on the data 22D serving as a read object in the NVRAM 22 by making use of an error correction code ECC2. In this case, the bit-error detection and correction processing making use of an error correction code ECC2 typically adopts the commonly taken hamming code method. It is to be noted that, if an uncorrectable bit error is detected, the NVM controller 23 typically informs the CPU 10 of the bit error. Then, at the next step S112, the NVM controller 23 supplies the data 22D obtained as a result of the bit-error detection and correction processing to the CPU 10. This step is the end of the processing represented by the flowchart shown in FIG. 6 as processing to read out the data 22D from the NVRAM 22 to the CPU 10.

The reader is advised to keep in mind that it is desirable to provide the configuration in which the NVM controller 23 makes use of a function described below as a function to prefetch error correction codes ECC2 from the NAND-type flash memory 21 to the ECC buffer 230 in the execution of the data reading processing described above, data writing processing to be described below and system activation processing. In order for the NVM controller 23 to make use of a function described below as a function to prefetch error correction codes ECC2 from the NAND-type flash memory 21 to the ECC buffer 230, first of all, the NVM controller 23 makes use of a record of past accesses to data 22D stored in the NVRAM 22 in order to predict data 22D stored in the NVRAM 22 as data to be accessed thereafter. Then, the NVM controller 23 prefetches error correction codes ECC2 for the predicted data 22D from the NVRAM 22 to the ECC buffer 230. By making use of such a function to prefetch error correction codes ECC2 from the NAND-type flash memory 21 to the ECC buffer 230, it is possible to easily sustain the performance of making accesses to the NVRAM 22 at a high speed.

Processing to Write Data into the NVRAM 22

FIG. 7 shows a flowchart representing typical processing to write data 22D into the NVRAM 22 by making use of error correction codes ECC2.

As shown in the figure, the flowchart representing the processing to write the data 22D into the NVRAM 22 begins with a step S201. At this step, the NVM controller 23 acquires the data 22D from the CPU 10 as a write object which is data to be written into the NVRAM 22. Then, at steps S203 to S210, the NVM controller 23 carries out the same processing as the steps S102 and S104 to S110 of the flowchart representing the data reading processing described above. Subsequently, the flow of the processing goes on to a step S202.

At the step S202, the NVM controller 23 carries out processing to generate an error correction code ECC2 for the acquired data 22D through computation of the error correction code ECC2 by adoption of typically the commonly taken hamming code method. Then, at the next step S211, the NVM controller 23 writes the error correction code ECC2 generated by computation into the ECC buffer 230 in order to update the existing error correction code ECC2. At that time, a page including the generated error correction code ECC2 is registered in the ECC buffer 230 as an updated page. In the mean time, at a step S212, the NVM controller 23 writes the data 22D into the NVRAM 22 concurrently with the steps S202 and S211. The steps S211 and S212 are the ends of the processing represented by the flowchart shown in FIG. 7 as processing to write the data 22D output by the CPU 10 into the NVRAM 22.

System Activation Processing

FIG. 8 shows a flowchart representing typical system activation processing to activate the non-volatile memory system 2 by making use of error correction codes ECC2.

As shown in the figure, the flowchart representing the system activation processing to activate the non-volatile memory system 2 begins with a step S301 at which the NVM controller 23 sets a start address in the NVRAM 22. Then, at steps S302 to S309, the NVM controller 23 carries out the same processing as the steps S101 to S104, S107, S105, S106 and S111 of the flowchart representing the data reading processing described above. Subsequently, the flow of the processing goes on to a step S310.

At the step S310, the NVM controller 23 determines whether or not an uncorrectable bit error has been detected in bit-error detection and correction processing carried out at the step S309. If the determination result produced at the step S310 is Yes indicating that an uncorrectable bit error has been detected in the bit-error detection and correction processing carried out at the step S309, the flow of the processing goes on to a step S311 at which the NVM controller 23 informs the CPU 10 of the uncorrectable bit error. This step is the end of the system activation processing represented by the flowchart shown in FIG. 8.

If the determination result produced at the step S310 is No indicating that no uncorrectable bit error has been detected in the bit-error detection and correction processing carried out at the step S309, on the other hand, the flow of the processing goes on to a step S312 at which the NVM controller 23 determines whether or not the address of the current data 22D serving as the object of the system activation processing is the last address in the NVRAM 22. If the determination result produced at the step S312 is No indicating that the address of the current data 22D serving as the object of the system activation processing is not the last address in the NVRAM 22, the flow of the processing goes on to a step S313 at which the NVM controller 23 increments the address of the current data 22D in the NVRAM 22 by 1. Then, the flow of the processing goes back to the step S303. If the determination result produced at the step S312 is Yes indicating that the address of the current data 22D serving as the object of the system activation processing is the last address in the NVRAM 22, on the other hand, the NVM controller 23 terminates the system activation processing represented by the flowchart shown in FIG. 8.

As described above, when the power supply of the non-volatile memory system 2 is turned on in order to activate the non-volatile memory system 2, the NVM controller 23 carries out the bit-error detection and correction processing making use of error correction codes ECC2 on all the data 22D stored in the NVRAM 22. Thus, it is possible to obtain the following result. Since the non-volatile memory system 2 is activated after the NVM controller 23 has verified that no bit error exists in all the data 22D stored in the NVRAM 22 used as a non-volatile cache memory, the reliability of the non-volatile memory system 2 can be improved.

In the embodiment described above, the error correction codes ECC2 are applied to the data 22D stored in the NVRAM 22 allowing random accesses to be made to the data 22D in word units and the error correction codes ECC2 are held in the NAND-type flash memory 21 used for storing the data 22D as data to be accessed in block (or page) units. Thus, it is possible to improve (or enhance) the data holding characteristic of the NVRAM 22 while preventing the speed of the access to the NVRAM 22 from decreasing. As a result, the reliability of the non-volatile memory system 2 can be improved without lowering the speed of its operation.

In addition, in this embodiment particularly, the error correction codes ECC2 are held in the NAND-type flash memory 21 having a relatively low bit-unit cost. Thus, the cost of the non-volatile memory system 2 can be suppressed.

Typical Modifications

Next, first and second typical modifications of the embodiment are explained. It is to be noted that configuration elements employed in the first and second typical modifications as elements identical with their respective counterpart elements included in the embodiment are denoted by the same reference numerals as the counterpart elements. In addition, the identical configuration elements are not explained again in the following description.

First Typical Modification

Figure 9:
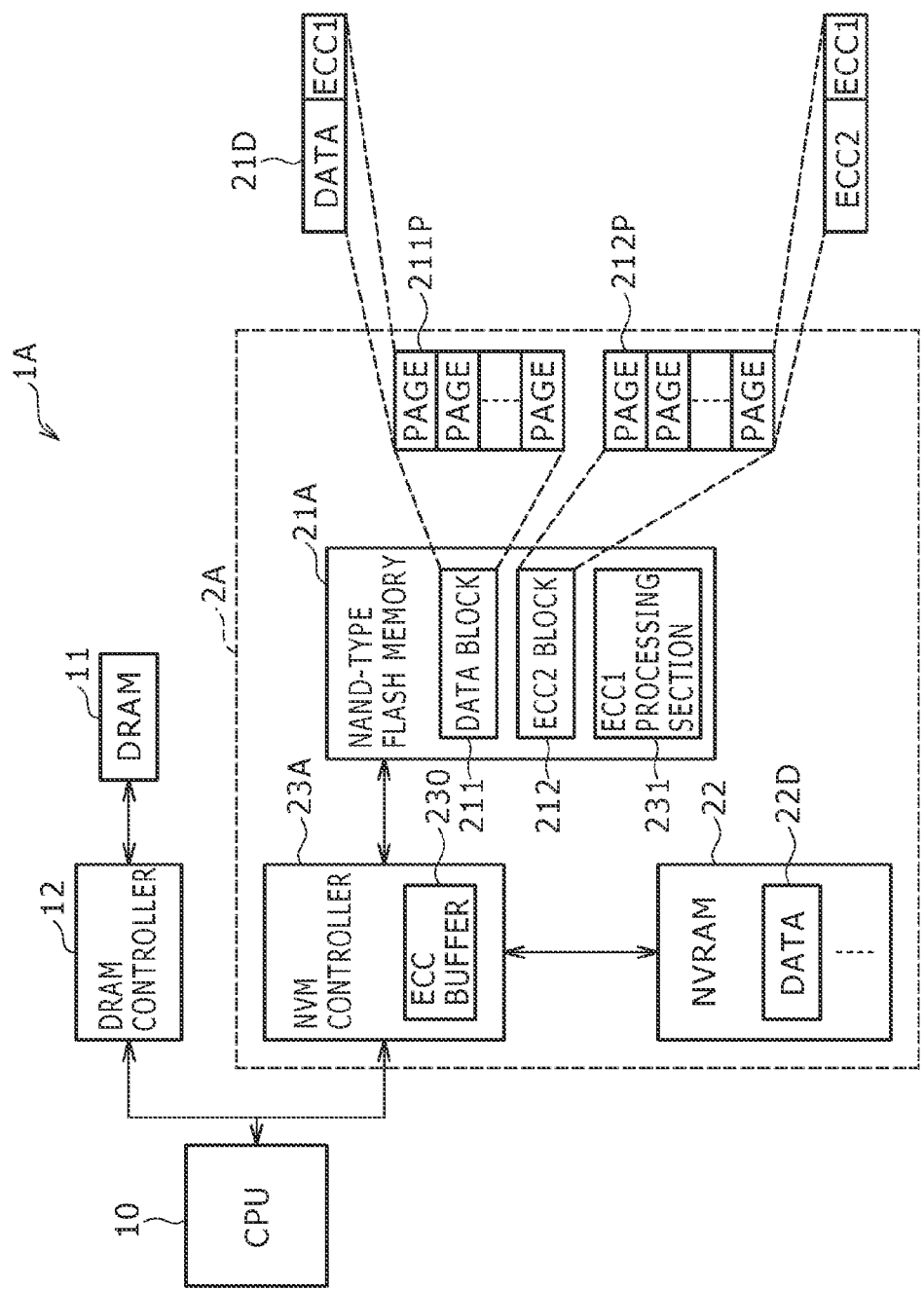
FIG. 9 is a block diagram showing a typical configuration of a data storage system including a memory system serving as a first typical modification.

FIG. 9 is a block diagram showing a typical configuration of a data storage system 1A including a non-volatile memory system 2A serving as a first typical modification of the non-volatile memory system 2 explained before. As shown in the figure, the data storage system 1A employs a CPU 10, a DRAM 11, a DRAM controller 12 and the non-volatile memory system 2A. That is to say, in place of the non-volatile memory system 2 employed in the data storage system 1 according to the embodiment, the data storage system 1A employs the non-volatile memory system 2A serving as the first typical modification. The other configuration elements employed in the data storage system 1A are identical with their respective counterpart configuration elements employed in the data storage system 1.

The non-volatile memory system 2A includes a NAND-type flash memory 21A having an embedded ECC, an NVRAM 22 and an NVM controller 23A.

The NAND-type flash memory 21A is characterized in that the NAND-type flash memory 21A has the ECC1 processing section 231 embedded therein. Thus, the NVM controller 23A in the first typical modification receives data obtained as a result of the bit-error detection and correction processing carried out by making use of an error correction code ECC1 from the NAND-type flash memory 21A and stores the data temporarily in the ECC buffer 230. Also in an operation to write data 21D into the NAND-type flash memory 21A, the NVM controller 23A supplies only the data 21D to the NAND-type flash memory 21A. The NAND-type flash memory 21A has a data block 211 composed of pages 211P each serving as the unit of the data block 211 and a ECC2 block 212 composed of pages 212P each serving as the unit of the data block 211. It is to be noted that the data structures of the pages 211P and 212P of the first typical modification are identical with respectively the data structures of the pages 211P and 212P of the embodiment. However, the NVM controller 23A is not capable of making an access to an area used for holding error correction codes ECC1 in the NAND-type flash memory 21A.

In recent years, there has been introduced a product in which a NAND-type flash memory includes an ECC processing section embedded therein as is the case with the NAND-type flash memory 21A. Also in the case of the non-volatile memory system 2A implemented by this typical modification as a system including such a product, it is possible to obtain the same effects by carrying out operations identical with those of the embodiment.

Second Typical Modification

Figure 10:
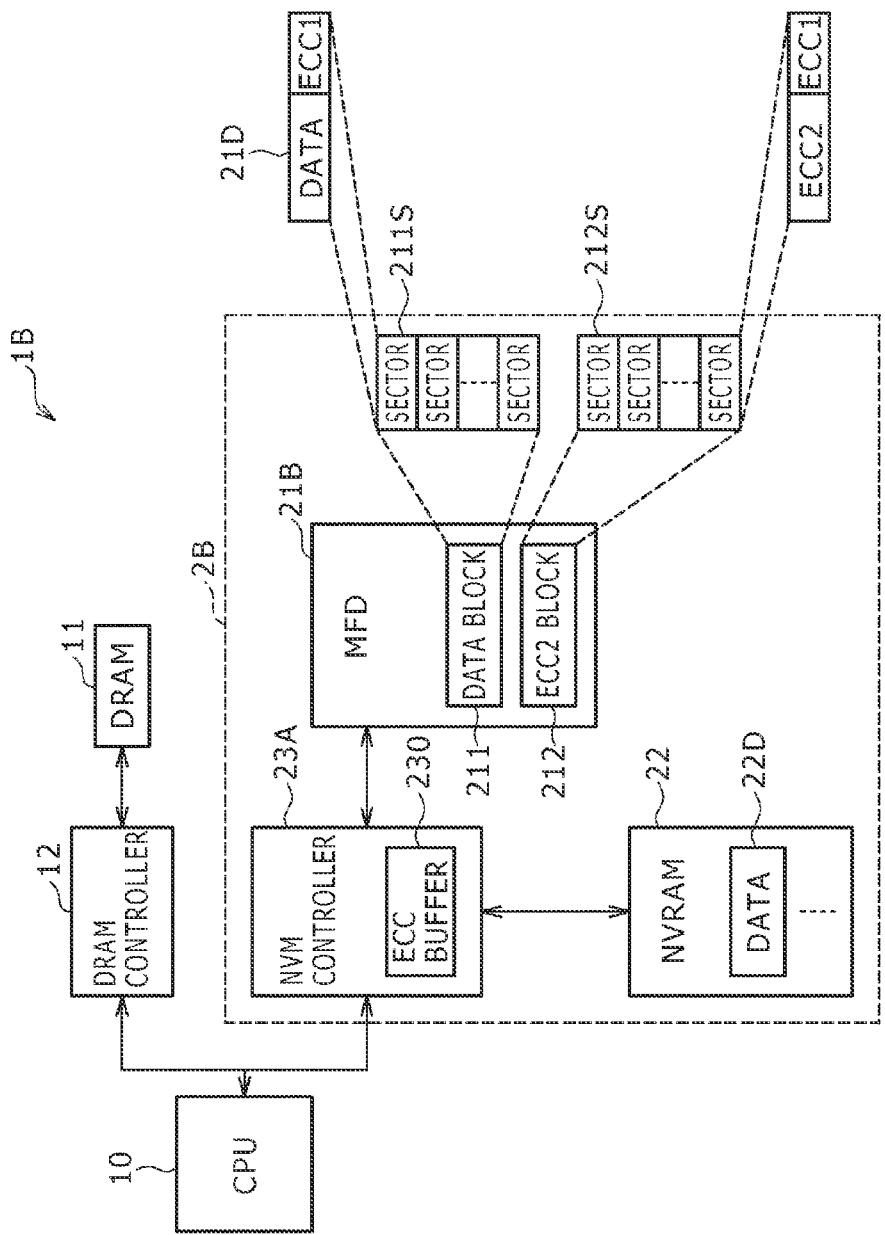
FIG. 10 is a block diagram showing a typical configuration of a data storage system including a memory system serving as the second typical modification.

FIG. 10 is a block diagram showing a typical configuration of a data storage system 1B including a non-volatile memory system 2B serving as a second typical modification of the non-volatile memory system 2 explained before. As shown in the figure, the data storage system 1B employs a CPU 10, a DRAM 11, a DRAM controller 12 and the non-volatile memory system 2B. That is to say, in place of the non-volatile memory system 2 employed in the data storage system 1 according to the embodiment, the data storage system 1B employs the non-volatile memory system 2B serving as the second typical modification. The other configuration elements employed in the data storage system 1B are identical with their respective counterpart configuration elements employed in the data storage system 1.

The non-volatile memory system 2B includes an MFD (Managed Flashed Drive) 21B, an NVRAM 22 and an NVM controller 23A. Typical examples of the MFD 21B include an SSD (Solid State Drive), an eMMC (Embedded MultiMedia Card), an SD card and a USB (Universal Serial Bus) memory. As described above, in the non-volatile memory system 2, the non-volatile memory system 2B employs the MFD 21B serving as the second typical modification in place of the NAND-type flash memory 21. The other configuration elements employed in the data storage system 1B are identical with their respective counterpart configuration elements employed in the data storage system 1.

The MFD 21B is a storage device including a NAND-type flash memory used for storing data to be accessed in block units. In this case, the block units are units of sectors 211S of the data block 211 and 212S of the ECC2 block 212. The MFD 21B is characterized in that the MFD 21B has a function embedded therein to operate as the same function as that embedded in the ECC1 processing section 231 described earlier. Thus, the NVM controller 23A in the second typical modification receives data obtained as a result of the bit-error detection and correction processing carried out by making use of an error correction code ECC1 from the MFD 21B and stores the data temporarily in the ECC buffer 230. Also in an operation to write data 21D into the MFD 21B, the NVM controller 23A supplies only the data 21D to the MFD 21B.

The MFD 21B has the data block 211 composed of sectors 211S each serving as the unit of the data block 211 and the ECC2 block 212 composed of sectors 212S each serving as the unit of the ECC2 block 212. It is to be noted that the data structures of the sectors 211S and 212S of the second typical modification are identical with respectively the data structures of the pages 211P and 212P of the embodiment. However, the NVM controller 23A is not capable of making an access to an area used for holding error correction codes ECC1 in the MFD 21B.

In recent years, there has been introduced a number of storage products like the MFD 21B. Also in the case of the non-volatile memory system 2B implemented by this typical modification as a system including such a product, it is possible to obtain the same effects by carrying out operations identical with those of the embodiment.

As described above, this typical modification is provided with the MFD 21B replacing the NAND-type flash memory 21. It is to be noted, however, that any storage device can be used to replace the NAND-type flash memory 21 provided that the storage device allows data stored therein to be accessed in block units each composed of a plurality of words by execution of a batch operation. For example, as a typical replacement for the NAND-type flash memory 21, it is possible to employ a hard disk allowing data stored therein to be accessed in sector units.

Other Typical Modifications

The present disclosure has been described so far by giving the embodiment and the typical modifications as examples. However, implementations of the present disclosure are by no means limited to these examples. That is to say, other modifications can be used as implementations of the present disclosure.

In the case of the embodiment for example, the DRAM 11 is used as a typical work memory of the data storage system 1. However, the work memory does not have to be a DRAM. For example, a volatile memory other than the DRAM can also be used as a work memory.

In addition, in the embodiment and the typical modifications, all (or some) of the functions of the NVM controller 23, the NVM controller 23A and the DRAM controller 12 can also be carried out by the CPU 10.

On top of that, as described above, the data storage system 1 includes the DRAM 11 and the DRAM controller 12 in addition to the CPU 10 and the non-volatile memory system 2. In some cases, however, the DRAM 11 and the DRAM controller 12 may be omitted. That is to say, the data storage system 1 can also be configured to include only the CPU 10 and the non-volatile memory system 2.

It should be understood by those skilled in the art that various modifications, combinations, sub-combinations and alterations may occur depending on design requirements and other factors insofar as they are within the scope of the appended claims or the equivalents thereof.

What is claimed is:

1. A memory controller comprising:
one or more processors operable to:
control operations of a first non-volatile memory for storing data to be accessed in units of blocks, and a second non-volatile memory for storing data to be accessed in word units in random accesses to said second non-volatile memory, wherein each of said blocks of said first non-volatile memory is divided into a first area and a second area,
wherein a first error correction codes to be applied to said data stored in said first non-volatile memory are stored in said second area of one or more of said blocks of said first non-volatile memory,
wherein a second error correction codes to be applied to said data stored in said second non-volatile memory are stored in said first area of said one or more of said blocks, and
wherein said second error correction codes are associated with consecutive addresses in said second non-volatile memory.

2. The memory controller according to claim 1, further comprising a buffer area operable to hold said second error correction codes read out from said first non-volatile memory to serve as said second error correction codes to be applied to data stored in said second non-volatile memory.

3. The memory controller according to claim 2, wherein, prior to application of said second error correction codes to data stored in said second non-volatile memory, said second error correction codes necessary for said data stored in said second non-volatile memory are read out from said first non-volatile memory to said buffer area before making use of said necessary second error correction codes in case said necessary second error correction codes do not exist in said buffer area.

4. The memory controller according to claim 3, wherein:
before reading out said necessary second error correction codes to said buffer area, said one or more processors are operable to determine whether or not said buffer area has an available area;
in case said one or more processors determine that said buffer area has an available area, said one or more processors are operable to store said necessary said second error correction codes read out from said first non-volatile memory in said available area; and
in case said one or more processors determine that said buffer area does not have an available area, said one or more processors are operable to change another area included in said buffer area to said available area, wherein said another area serves as an area used for holding said second error correction codes with low usage frequency compared to usage frequency of other said second error correction codes for storing said necessary second error correction codes.

5. The memory controller according to claim 4, wherein, before changing said another area to said available area, said one or more processors are operable to write said second error correction codes of said another area into said first non-volatile memory in case said second error correction codes of said another area have been changed.

6. The memory controller according to claim 3, wherein said one or more processors are operable to:
use a record of past accesses to data stored in said second non-volatile memory in order to predict data which has been stored in said second non-volatile memory as data to be accessed in future; and
prefetch said second error correction codes necessary for said predicted data from said first non-volatile memory to said buffer area.

7. The memory controller according to claim 2, wherein said one or more processors are operable to:
apply said second error correction codes to data which is to be written into said second non-volatile memory, prior to a write operation to write said data into said second non-volatile memory and then carries out said write operation; and perform bit-error detection and correction processing on data read out from said second non-volatile memory by making use of said second error correction codes after an operation to read out said data from said second non-volatile memory and at a system activation time.

8. The memory controller according to claim 7, wherein said one or more processors are operable to make use of said second error correction codes applied to said data written into said second non-volatile memory to update contents of said buffer area in said write operation.

9. The memory controller according to claim 1, wherein said one or more processors are operable to carry out management to associate addresses of pieces of data in said second non-volatile memory with addresses of said second error correction codes in said first non-volatile memory necessary for said pieces of data.

10. The memory controller according to claim 1, wherein every batch of a plurality of said first error correction codes and said second error correction codes is held in said first non-volatile memory as said block.

11. The memory controller according to claim 1, wherein said first non-volatile memory is: a flash memory used for storing data to be accessed in page units each serving as one of said blocks; or a hard disk used for storing data to be accessed in sector units each serving as one of said blocks.

12. The memory controller according to claim 1, further comprising a first error correction code processing section embedded in said first non-volatile memory for using said first error correction codes to be applied to said data stored in said first non-volatile memory.

13. The memory controller according to claim 1, further comprising a first interface to access data from said second non-volatile memory and a second interface different from said first interface to access said second error correction codes.

14. An operation method provided for a memory controller, the method comprising:
performing accesses made in units of blocks to data stored in a first non-volatile memory;
performing random accesses made in word units to data stored in a second non-volatile memory,
wherein error correction codes to be applied to said data stored in said second non-volatile memory are stored in a first area of one or more of said blocks of said first non-volatile memory;
wherein said error correction codes are associated with consecutive addresses in said second non-volatile memory; and
carrying out bit-error detection and correction processing on said data stored in said second non-volatile memory based on said error correction codes.

15. A system comprising:
one or more processors operable to:
store data in a first non-volatile memory to be accessed in units of blocks;
store data to be accessed in word units in random accesses to a second non-volatile memory; and
control operations of said first non-volatile memory and said second non-volatile memory,
wherein error correction codes to be applied to said data stored in said second non-volatile memory are stored in a first area of one or more of said blocks of said first non-volatile memory, and
wherein said error correction codes are associated with consecutive addresses in said second non-volatile memory.

16. The system according to claim 15, further comprising a controller operable to control operations of a dynamic random access memory (DRAM), wherein said controller is operable to write data stored in said DRAM into said first non-volatile memory and said second non-volatile memory.

17. The system according to claim 15, wherein each of said blocks of said first non-volatile memory is divided into said first area and a second area.

18. The system according to claim 17, wherein error correction codes to be applied to said data stored in said first non-volatile memory are stored in said second area of said one or more of said blocks of said first non-volatile memory.

* * * * *